United States Patent
Kuo et al.

(10) Patent No.: US 8,519,515 B2
(45) Date of Patent: Aug. 27, 2013

(54) TSV STRUCTURE AND METHOD FOR FORMING THE SAME

(75) Inventors: Chien-Li Kuo, Hsinchu (TW); Chia-Fang Lin, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 99 days.

(21) Appl. No.: 13/085,488

(22) Filed: Apr. 13, 2011

(65) Prior Publication Data

US 2012/0261826 A1 Oct. 18, 2012

(51) Int. Cl.
*H01L 29/40* (2006.01)
*H01L 21/44* (2006.01)

(52) U.S. Cl.
USPC ............ 257/621; 257/E23.011; 257/E23.067; 257/E21.597; 257/E23.168; 438/667

(58) Field of Classification Search
USPC ........... 257/621, E23.011, E23.067, E23.168, 257/E21.597; 438/667
See application file for complete search history.

(56) References Cited

U.S. PATENT DOCUMENTS

| | | | |
|---|---|---|---|
| 5,229,647 A | 7/1993 | Gnadinger | |
| 5,399,898 A | 3/1995 | Rostoker | |
| 5,463,246 A | 10/1995 | Matsunami | |
| 5,484,073 A | 1/1996 | Erickson | |
| 6,407,002 B1 | 6/2002 | Lin | |
| 6,548,891 B2 | 4/2003 | Mashino | |
| 6,627,985 B2 | 9/2003 | Huppenthal | |
| 6,800,930 B2 | 10/2004 | Jackson | |
| 6,924,551 B2 | 8/2005 | Rumer | |
| 7,033,934 B2 * | 4/2006 | Iijima et al. | 438/667 |
| 7,034,401 B2 | 4/2006 | Savastiouk | |
| 7,282,951 B2 | 10/2007 | Huppenthal | |
| 7,432,592 B2 | 10/2008 | Shi | |
| 7,525,186 B2 * | 4/2009 | Kim et al. | 257/686 |
| 7,531,415 B2 | 5/2009 | Kwok | |
| 7,932,584 B2 * | 4/2011 | Trezza | 257/621 |
| 7,964,972 B2 * | 6/2011 | Matsui | 257/774 |
| 8,148,824 B2 * | 4/2012 | Lin | 257/774 |
| 8,168,533 B2 * | 5/2012 | Kuo | 438/667 |
| 8,202,801 B1 * | 6/2012 | Lin | 438/667 |
| 8,384,207 B2 * | 2/2013 | Toshima et al. | 257/698 |
| 2002/0017399 A1 * | 2/2002 | Chang et al. | 174/262 |
| 2004/0080041 A1 | 4/2004 | Kimura | |
| 2007/0126085 A1 | 6/2007 | Kawano | |
| 2007/0161235 A1 * | 7/2007 | Trezza | 438/667 |
| 2007/0190692 A1 | 8/2007 | Erturk | |
| 2008/0073747 A1 | 3/2008 | Chao | |
| 2008/0079131 A1 * | 4/2008 | Kim et al. | 257/686 |
| 2009/0134498 A1 | 5/2009 | Ikeda | |
| 2009/0189256 A1 * | 7/2009 | Yoshimura et al. | 257/621 |
| 2010/0072579 A1 * | 3/2010 | Thies et al. | 257/621 |
| 2010/0140749 A1 | 6/2010 | Kuo | |
| 2010/0224965 A1 * | 9/2010 | Kuo | 257/621 |
| 2011/0171829 A1 * | 7/2011 | Wang | 438/667 |
| 2011/0210426 A1 * | 9/2011 | Matsui | 257/621 |
| 2012/0112324 A1 * | 5/2012 | Huang | 257/621 |

* cited by examiner

*Primary Examiner* — David Zarneke
(74) *Attorney, Agent, or Firm* — Winston Hsu; Scott Margo (57) ABSTRACT

A TSV structure includes a through via connecting a first side and a second side of a wafer, a conductive layer which fills up the through via, a through via dielectric ring surrounding and directly contacting the conductive layer, a first conductive ring surrounding and directly contacting the through via dielectric ring as well as a first dielectric ring surrounding and directly contacting the first conductive ring and surrounded by the wafer.

21 Claims, 7 Drawing Sheets

TSV STRUCTURE AND METHOD FOR FORMING THE SAME

BACKGROUND OF THE INVENTION

1. Field of the Invention

The present invention generally relates to a TSV (through-silicon via) structure and the method for forming the TSV structure. In particular, the present invention is directed to a through-silicon via with a double-ring structure in order to reduce the adverse electric coupling effect between the conductive substrate in the wafer and the conductive material in the through-silicon via structure.

2. Description of the Prior Art

The through-silicon via technique is a quite novel semiconductor technique. The through-silicon via technique mainly resides in solving the problem of the electrical interconnection of chips and belongs to a new 3D packing field. The hot through-silicon via technique creates products which better meet the market trends of "light, thin, short and small" by the 3D stacking through the through-silicon via, to provide the micro electronic mechanic system (MEMS), the photoelectronics and electronic elements with packing techniques of wafer-level package.

The through-silicon via technique drills holes in the wafer by etching or by laser then fills the holes with conductive materials, such as copper, polysilicon or tungsten to form vias, i.e. conductive channels connecting inner regions and outer regions. At last, the wafer or the dice is thinned to be stacked or bonded together to be a 3D stack IC. In such a way, the wire bonding procedure may be omitted. Using etching or laser to form conductive vias not only omits the wire bonding but also shrinks the occupied area on the circuit board and the volume for packing.

The inner connection distance of the package by the through-silicon via technique, i.e. the thickness of the thinned wafer or the dice, compared with the conventional stack package of wire bonding type, the 3D stack IC has much shorter inner connection distance, so the 3D stack IC performs better in many ways, such as smaller electrical resistance, faster transmission, first noise and better performance. Especially for the CPU, flash memory and memory card, the advantages of the shorter inner connection distance of the through-silicon via technique are much more outstanding. In addition, the package size of the 3D stack IC equals to the size of the dice, so the through-silicon via technique is more valuable in the portable electronic devices.

For the current process and techniques, the through-silicon via technique may divided into two types, namely the via first or the via last. The via first process further includes two variations, called before CMOS and after CMOS. In the via-first-before-CMOS process, through-silicon holes are formed on the silicon wafer and filled with a conductive material before the formation of the CMOS. Considering the high temperature procedures in the later CMOS process, the selection of the conductive material is basically focused on those which can survive after high temperatures, such as poly silicon, rather than the better copper because copper tends to form pumping and is unable to keep a low electrical resistance after being subject to thermal processes over and over again. To be viewed as a whole, the via-first-before-CMOS process is more compatible with the conventional CMOS process. However, the conductive material must bear high temperatures.

In the via-first-after-CMOS process, the formation of the via and the filling of the conductive metal are done after the completion of the CMOS process. The current choice of the conductive metal is copper, which is much better than poly silicon in conductivity concern. Because the filling of copper may fail and some voids are formed due to the formation of void, tungsten gradually becomes an alternative choice. To be viewed as a whole, the filling of copper is particularly difficult and there is possible contamination of copper because the CMOS is completed, which makes it less compatible with the conventional CMOS process.

On top of them, there is an electric coupling effect between the conductive substrate in the wafer and the conductive material in the through-silicon via structure to adversely affect the performance of the device when the device is in operation since both the core conductive layer in the through-silicon via structure as well as the substrate are electrically conductive. As a result, a novel through-silicon via structure as well as a novel method for making such through-silicon via structure are still needed to reduce or even to eliminate the undesirable electric coupling effect between the conductive substrate in the wafer and the core conductive material in the through-silicon via structure.

SUMMARY OF THE INVENTION

The present invention proposes a novel TSV (through-silicon via) structure and the method for forming the TSV structure. The through-silicon via structure of the present invention has a specially designed composite ring structure in order to reduce or to eliminate the adverse electric coupling between the conductive substrate in the wafer and the conductive material in the through-silicon via structure.

The present invention in a first aspect proposes a novel TSV structure. The TSV structure of the present invention includes a wafer, a through via, a conductive layer, a through via dielectric ring, a first conductive ring or a first substrate ring and a first dielectric ring. The wafer includes a first side and a second side. The through via is for use in connecting the first side and the second side of the wafer. The conductive layer fills up the through via and the through via dielectric ring surrounds and directly contacts the conductive layer. The first conductive ring or the first substrate ring surrounds and directly contacts the through via dielectric ring. The first dielectric ring surrounds and directly contacts the first conductive ring and is surrounded by the wafer.

The present invention in a second aspect proposes a method for forming a through-silicon via structure. First, a wafer is provided. The wafer includes a substrate, a first side and a second side. Second, a composite annular structure is formed in the wafer. The composite annular structure includes a core substrate column, a through via dielectric ring, a first substrate ring, and a first dielectric ring. The through via dielectric ring includes a dielectric material, surrounds and directly contacts the core substrate column. The first substrate ring surrounds and directly contacts the through via dielectric ring. The first dielectric ring surrounds and directly contacts the first substrate ring and is surrounded by the wafer. Then the wafer is thinned from the second side to expose the composite annular structure. Next, a second dielectric layer is formed to cover the second side and to expose the composite annular structure. Later, the substrate in the core substrate column is completely removed to form a through via which connects the first side and the second side. Afterwards, the through via is filled up with a core conductive layer to obtain the through-silicon via structure.

In a first embodiment of the present invention, the first substrate ring may be completely removed to form a first hollow ring before the first hollow ring is filled up with a first conductive material so that the first hollow ring becomes a first conductive ring. In a second embodiment of the present invention, a semiconductor procedure may be carried out after the through-silicon via structure is obtained. In a third embodiment of the present invention, a semiconductor procedure may be carried out before the through-silicon via structure is obtained. In a fourth embodiment of the present invention, a multi-layer metal structure may be formed to be disposed on the first side and includes a first layer, a second layer and a third layer. A first conductive ring first extension part is composed of the first layer. A third conductive ring third extension part is composed of the third layer. A conductive layer extension part is composed of the second layer. In such a way, the first conductive ring first extension part and the third conductive ring third extension part together sandwich the conductive layer extension part to shield the adverse interaction between the wafer and the conductive layer extension part. In a fifth embodiment of the present invention, the conductive layer extension part may further have a serpent-like structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 7-10C and 12 illustrate the through-silicon via structure of the present invention.

DETAILED DESCRIPTION

The present invention in a first place provides a novel method for forming a TSV structure. The method of the present invention in particular forms a composite ring structure in order to reduce or to eliminate the adverse electric coupling between the conductive substrate in the wafer and the conductive material in the through-silicon via structure.

FIGS. 1-10 illustrate the method for forming a through-silicon via structure of the present invention. First please refer to FIG. 1, a wafer 103 is provided. The wafer 103 is for use in forming a through-silicon via structure and includes a semiconductor substrate 103. The wafer 103 also includes a first side 101 and a second side 102 which is opposite to the first side 101. The first side 101 may be a front side of a semiconductor substrate for the preparation of various semiconductor elements and metal interconnection. The second side 102 may be a bottom side of a semiconductor substrate. The semiconductor substrate 103 may be Si.

Figure 1:
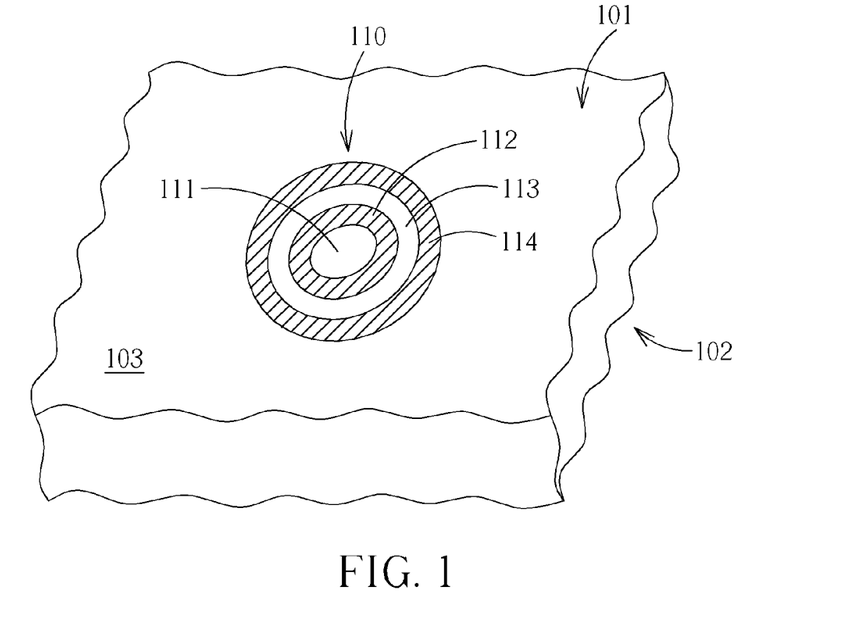
FIGS. 1-6 illustrate the method for forming a through-silicon via structure of the present invention.

Second, a composite annular structure 110 is formed in the wafer 103. The composite annular structure 110 includes at least a core substrate column 111, a through via dielectric ring 112, a first substrate ring 113, and a first dielectric ring 114. The through via dielectric ring 112 includes a dielectric material, surrounds and directly contacts the core substrate column 111. The first substrate ring 113 is located outside of the through via dielectric ring 112 so it surrounds and directly contacts the through via dielectric ring 112. The first dielectric ring 114 is located outside of the first substrate ring 113 so it surrounds and directly contacts the first substrate ring 113 and it is at the same time surrounded by the semiconductor substrate 103 in the wafer.

The composite annular structure 110 may be formed along with the formation of the shallow trench isolation (not shown). For example, lithographic and etching steps may be used to form recesses (not shown) in the wafer 103 to respectively define the through via dielectric ring 112, the first dielectric ring 114 in the composite annular structure 110 and the shallow trench (not shown). The size of the openings on the reticle and etching recipes may be used to control the depth of the recesses and the shallow trenches. Preferably, the depth of the recesses should be deeper than that of the shallow trenches. Later, a dielectric material, such as silicon oxide, may be used to fill the recesses and the shallow trenches, followed by planarization to respectively obtain the through via dielectric ring 112, the first dielectric ring 114 in the composite annular structure 110 and the shallow trench (not shown). Optionally, the ring thickness of the through via dielectric ring 112 and the first dielectric ring 114 in the composite annular structure 110 may be 2 μm-3 μm.

Figure 2:
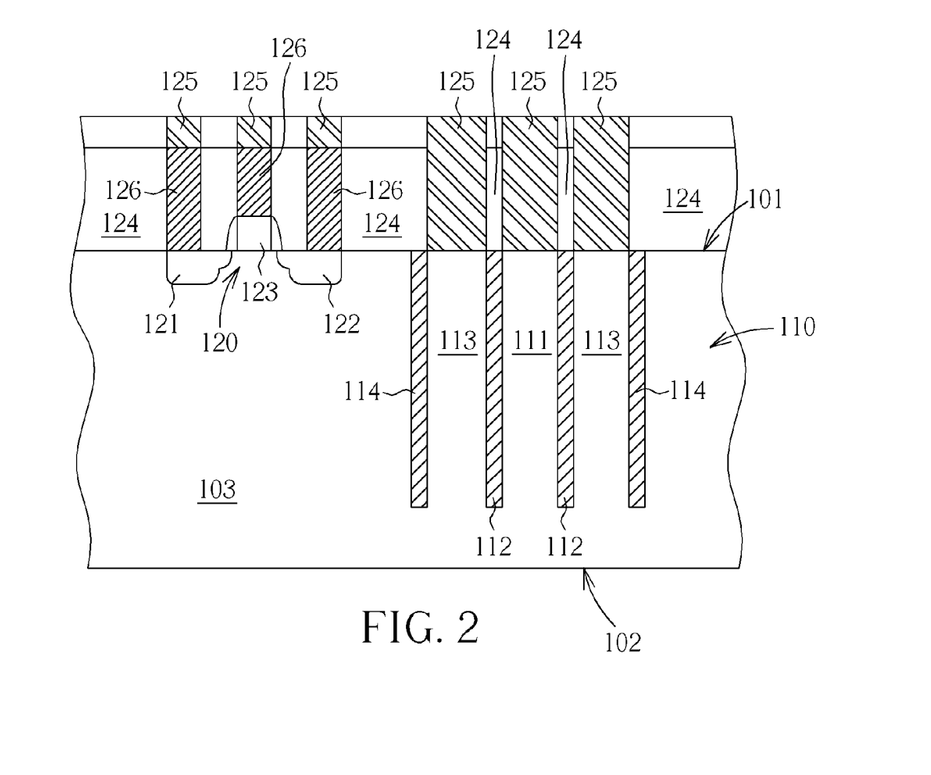

Next, please refer to FIG. 2, an optional semiconductor procedure is carried out. The semiconductor procedure may be any suitable semiconductor procedure. For example, a semiconductor element 120 is accordingly formed on the first side 101 after this semiconductor procedure, and an interlayer dielectric layer 124 is formed on the semiconductor element 120 to cover the semiconductor element 120 as well as an interconnection structure 125 disposed on the interlayer dielectric layer 124 and electrically connected to the semiconductor element 120. The optional semiconductor procedure may be carried out before or after the completion of the expected TSV structure. FIG. 2 illustrates the optional semiconductor procedure is carried out before the completion of the expected TSV structure.

In this embodiment, the semiconductor element 120 may include a gate 123, and a source 121 and a drain 122 disposed adjacent to the gate 123. Optionally, there may be an etching-stop layer and/or a stress layer formed on the semiconductor element 120 before the interlayer dielectric layer 124 is formed. The interconnection structure 125 penetrates the interlayer dielectric layer 124 and is electrically connected to the corresponding source 121, the drain 122 and the gate 123 on the first side 101 through some contact plugs 126. The interlayer dielectric layer 124 may include one or more dielectric material, such as silicon oxide, silicon nitride, low-k dielectric material, silicon oxynitride, silicon carbide or the combination thereof. The interconnection structure 125 may be a copper damascene conductive structure made by damascene steps and including a barrier layer, a seed layer and a copper layer. The contact plugs 126 usually include W, and Ti or TiN for use as a barrier layer.

Figure 3:
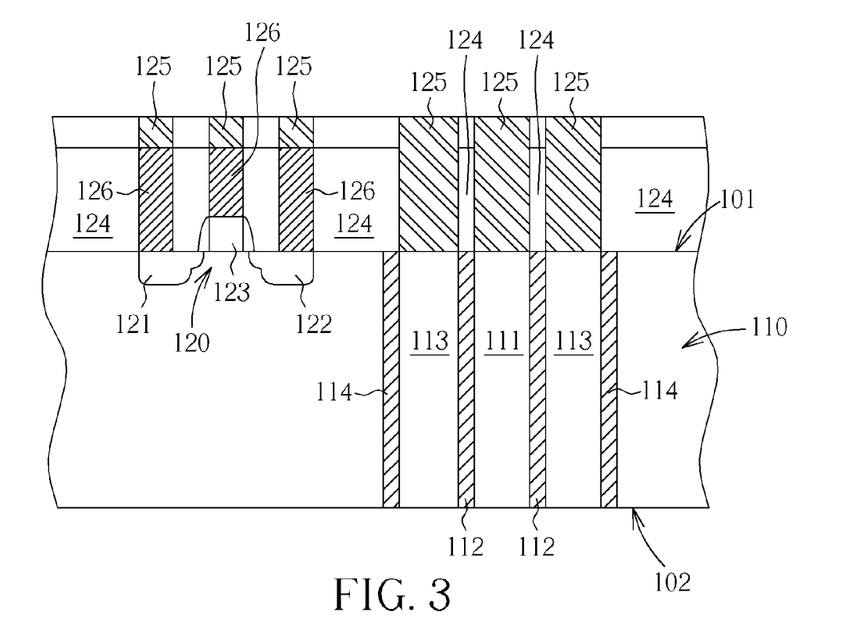

Next, please refer to FIG. 3, a wafer thinning procedure is carried out and the wafer 103 is thinned from the second side 102 to expose the core substrate column 111, the through via dielectric ring 112, the first substrate ring 113, and the first dielectric ring 114 in the composite annular structure 110 after the needed semiconductor elements and the metal interconnection (the interconnection structure 125 and some contact plugs 126 standing for the entire metal interconnection in FIG. 3) are formed on the first side 101. Part of the wafer 103 may be removed, for example by polishing, to expose the composite annular structure 110. An organic material, such as an adhesive (not shown), may be used to attach the first side 101 of the wafer 103 to a carrier (not shown). Then, a polishing step is carried out to remove part of the wafer 103 so as to expose the composite annular structure 110. The core substrate column 111, the through via dielectric ring 112, the first substrate ring 113, and the first dielectric ring 114 all may be concentric.

Figure 4:
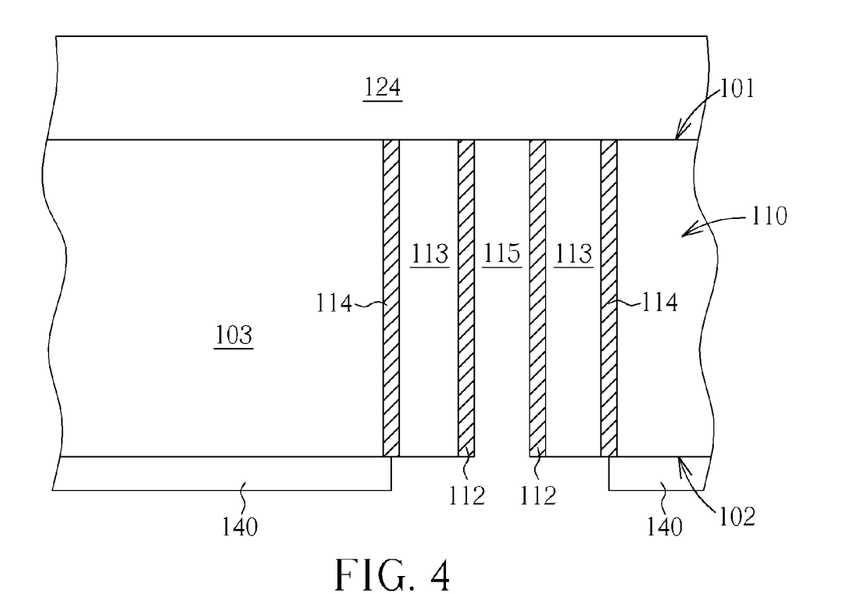

Later, please refer to FIG. 4 a second dielectric layer 140 is formed. The second dielectric layer 140 not only covers the second side 102, but also exposes the composite annular structure 110. The steps to form the second dielectric layer 140 may be: a dielectric material, such as silicon oxide or silicon nitride, is first used to completely cover the second side 102, followed by some lithographic steps along with some etching steps to selectively remove some of the dielectric material, in order to precisely expose the annular dielectric layer 110. FIG. 4 illustrates the absence of the optional semiconductor procedure.

Afterwards, the exposed substrate 103 in the core substrate column 111 within the composite annular structure 110 is needed to be completely removed so that the core substrate column 111 becomes a through via 115, so the through via 115 connects the first side 101 and the second side 102. Suitable etching procedure(s), such as a dry etching procedure and/or a wet etching procedure, may be used to completely remove the corresponding and exposed substrate 103 in the core substrate column 111 with the assistance of a photoresist.

Figure 5:
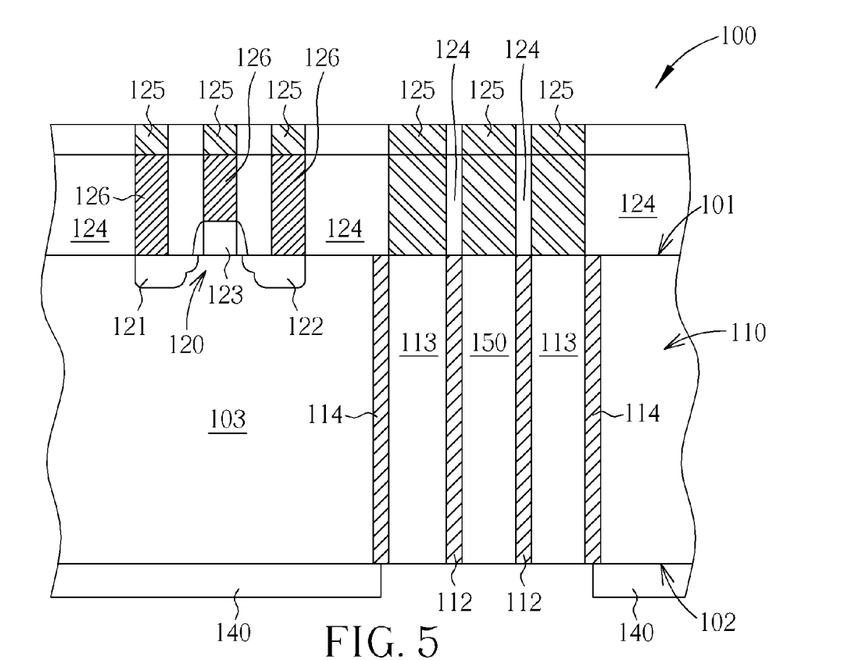

Then please refer to FIG. 5, a core conductive layer 150 is used to fill up the through via 115 to obtain a through-silicon via structure 100. For example, the core conductive layer 150 is used to fill up the through via 115 by deposition, and directly or indirectly electrically connected to the interconnection structure 125. The core conductive layer 150 usually includes a low-resistant material, such as copper. The core conductive layer 150 of the through-silicon via structure 100 may be in a form of a column with a diameter of 5 µm-20 µm.

Optionally, before the through via 115 is filed up with a core conductive layer 150, at least one of a barrier layer (not shown) and a seed layer (not shown) may be formed on the inner wall of the through via dielectric ring 112 to cover the surface of the through via dielectric ring 112. When the core conductive layer 150 includes copper, the barrier layer (not shown) may keep the copper from experiencing adverse diffusion. In another aspect, the seed layer (not shown) is useful in inducing the deposition of the conductive layer 150.

Figure 6:
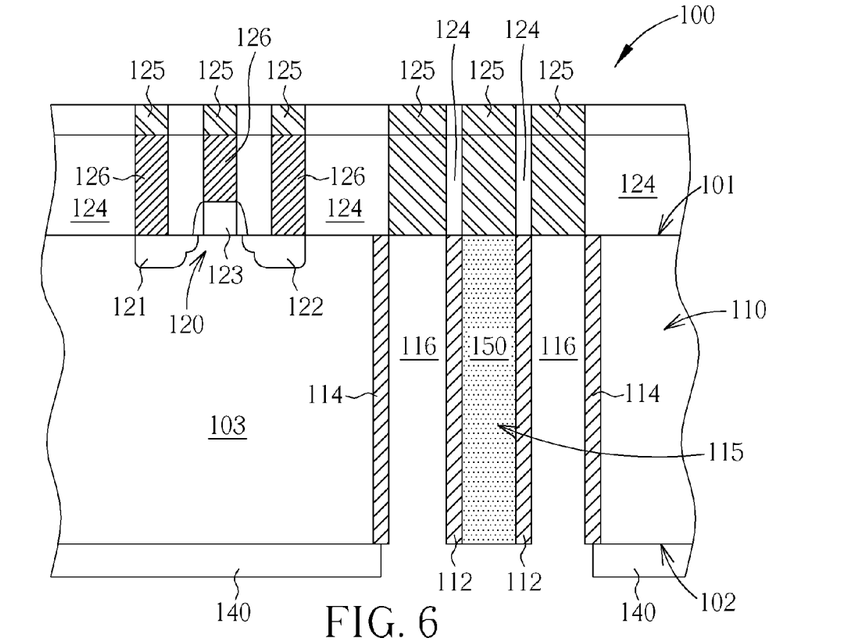
Figure 7:
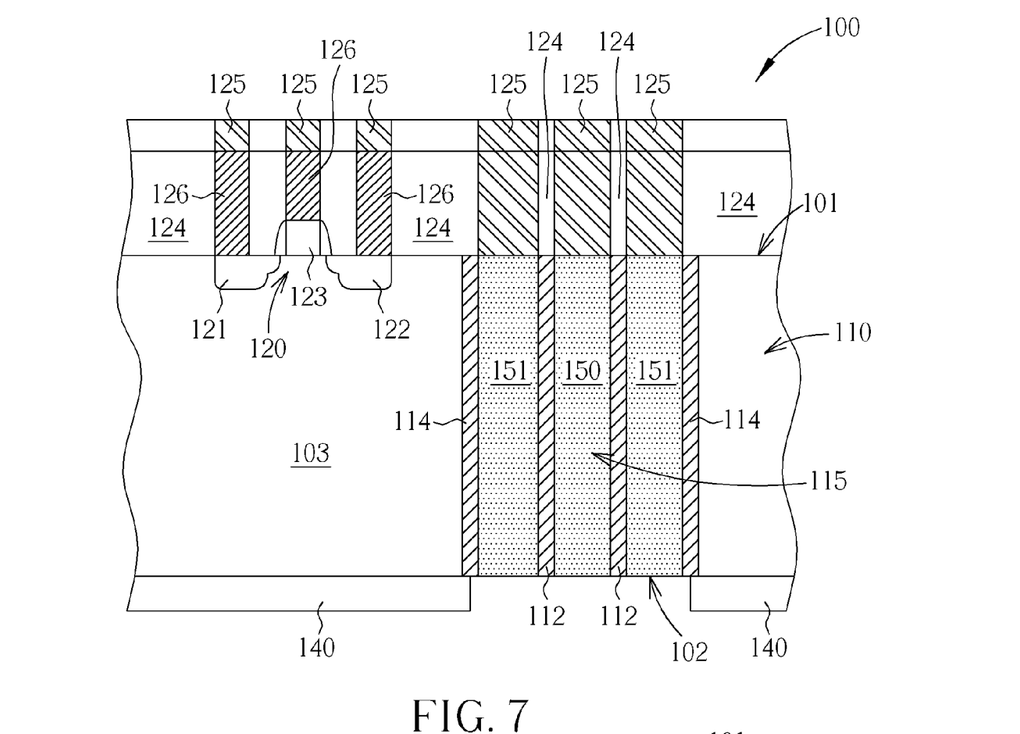

Optionally, as shown in FIG. 6, the substrate 103 in the first substrate ring 113 may be simultaneously and completely removed to form a first hollow ring 116 when the exposed substrate 103 in the core substrate column 111 within the composite annular structure 110 is completely removed. Next, as shown in FIG. 7, the first hollow ring 116 is filled up with a first conductive material 151 just like the core conductive layer 150 filling up the through via 115 so that the first hollow ring 116 becomes a first conductive ring 151. Optionally, the core conductive layer 150 and first conductive material 151 may be the same or different from each other. If the core substrate column 111 and the first substrate ring 113 are simultaneously and completely removed, the same conductive material may be used for filling-up. If the core substrate column 111 and the first substrate ring 113 are respectively and completely removed, different materials may be respectively used for filling-up.

Figure 8:
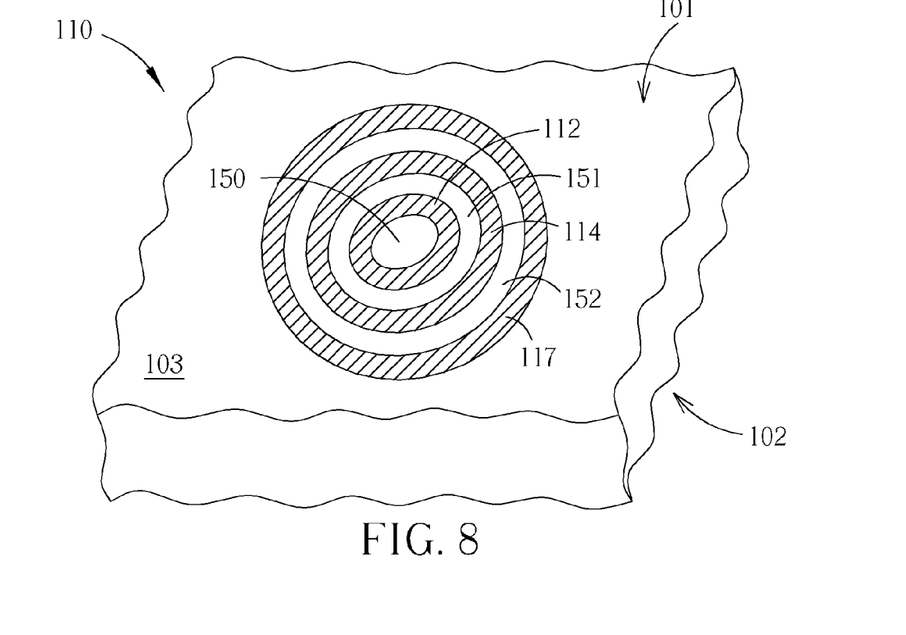

Optionally, as shown in FIG. 8, at least a set of concentric conductive ring and dielectric ring may be formed outside of the first dielectric ring 114. For example, a second conductive ring 152 as well as a second dielectric ring 117 are formed. On one hand, the second conductive ring 152 surrounds and directly contacts the first dielectric ring 114. On the other hand, the second dielectric ring 117 surrounds and directly contacts the second conductive ring 152, and is surrounded by the wafer 103. The method for forming the concentric conductive ring and dielectric ring is described in the previous descriptions and the details will not be elaborated here.

In one embodiment of the present invention, the core conductive layer 150 in the through-silicon via structure 100 and the outer conductive ring (for example, the second conductive ring 152 in FIG. 8) may be formed on the same side (for example on the first side 101 or on the second side 102). Or, the core conductive layer 150 in the through-silicon via structure 100 may be formed on the first side 101 before the outer conductive ring is formed on the second side 102. Alternatively, the outer conductive ring may be formed on the first side 101 before the core conductive layer 150 in the through-silicon via structure 100 is formed on the second side 102.

In another embodiment of the present invention, the core conductive layer 150 in the through-silicon via structure 100 and the outer conductive ring may be formed in various steps. For example, they may be formed before the semiconductor element 120 is formed. Or, they may be formed after the semiconductor element 120 is formed but before the first layer (M1) in the interconnection structure 125 is formed. Alternatively, they may be formed after the interconnection structure 125 is completed. There are still other possible variations.

In still another embodiment of the present invention, the core conductive layer 150 or the outer conductive ring on the first side 101 may extend differently. For example, the core conductive layer 150 or the outer conductive ring formed before the formation of the semiconductor element 120 may be disposed solely in the substrate 103. Or, the core conductive layer 150 or the outer conductive ring formed after the semiconductor element 120 but before the first layer (M1) in the interconnection structure may extend integrally from the substrate 103 to the contact plugs 126. Alternatively, the core conductive layer 150 or the outer conductive ring formed after the interconnection structure may extend integrally from the substrate 103 to the outmost layer of the interconnection structure. As a result, the length of the core conductive layer 150 or the outer conductive ring may be different made from different timings.

Figure 9:
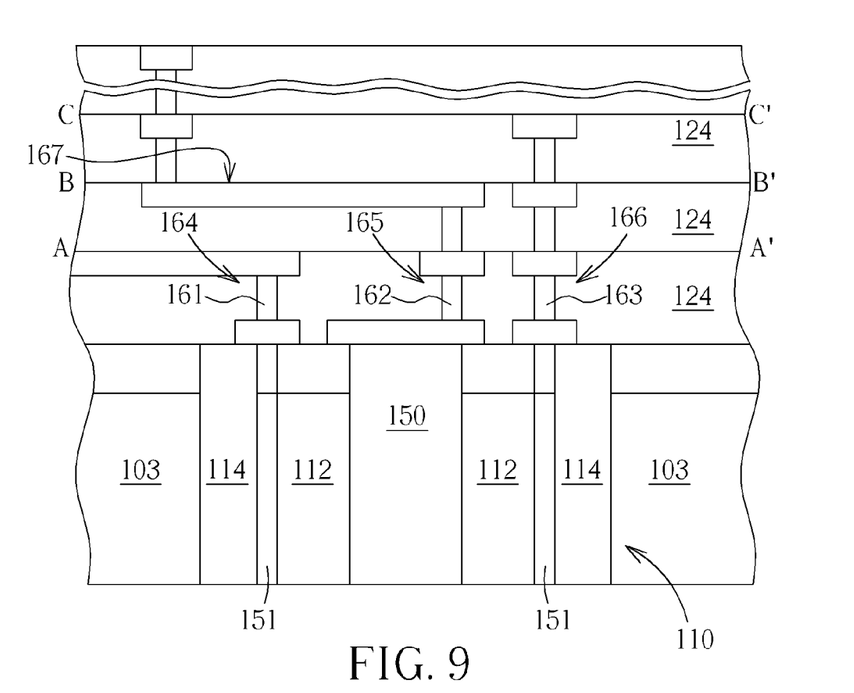
Figure 10A:
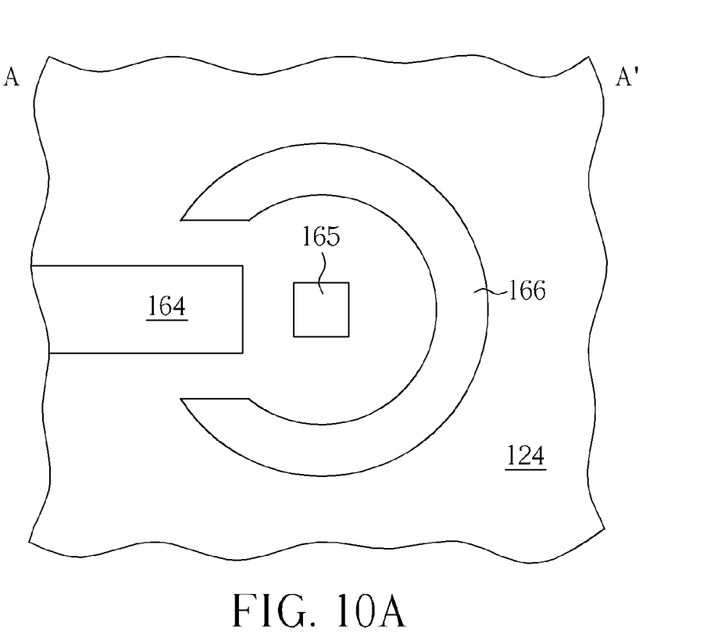

Optionally, as shown in FIG. 9, the interconnection structure 125 in the optional semiconductor procedure may be a multi-layer metal structure 160. The multi-layer metal structure 160 may be disposed on the first side 101 and includes a first conductive structure 161, a second conductive structure 162 and a third conductive structure 163. The first conductive structure 161 and the third conductive structure 163 may be part of the annular metal structure 110 or they may be substantially not connected to each other. In one embodiment of the present invention, the second conductive structure 162 and the third conductive structure 163 may respectively have a void. For example, as shown in FIG. 10A, the third conductive structure 163 may be a ring with a void which allows the second conductive structure 162 to pass through. Or alternatively, the second conductive structure 162 may be a round with a void which allows the first conductive structure 161 to pass through. In such a way, the needed multi-layer metal structure 160 is constructed.

In addition, please refer to FIG. 9, the first conductive material 151 may form the first conductive ring first extension part 164 with the first conductive structure 161 so the first conductive ring first extension part 164 is formed from the first conductive structure 161. Similarly, the first conductive material 151 may form the first conductive ring third extension part 166 with the third conductive structure 163 so the first conductive ring third extension part 166 is formed from the third conductive structure 163. Besides, the second conductive structure 162 in the multi-layer metal structure 160 forms a conductive layer second extension part 165. In such a way, the first conductive ring first extension part 164 and the first conductive ring third extension part 166 together sandwich the conductive layer second extension part 165 to shield the adverse interaction between the wafer 103 and the conductive layer second extension part 165.

Figure 10B:
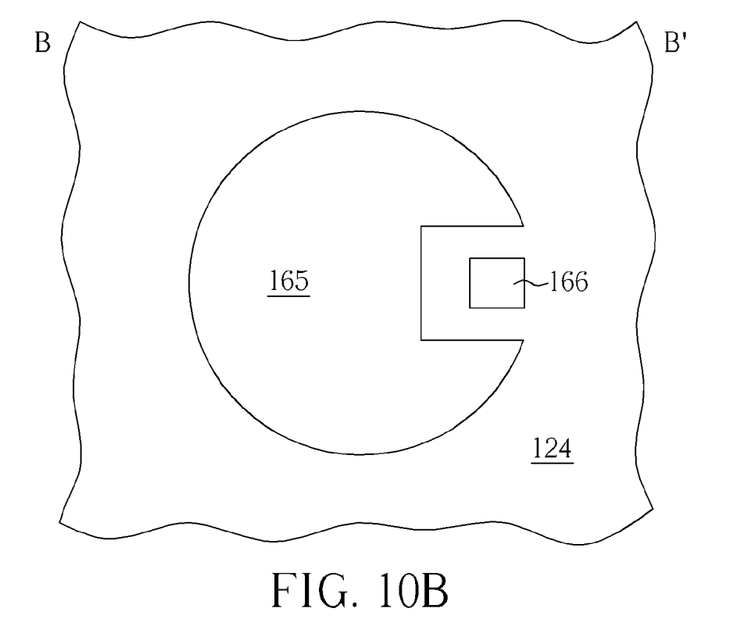
Figure 10C:
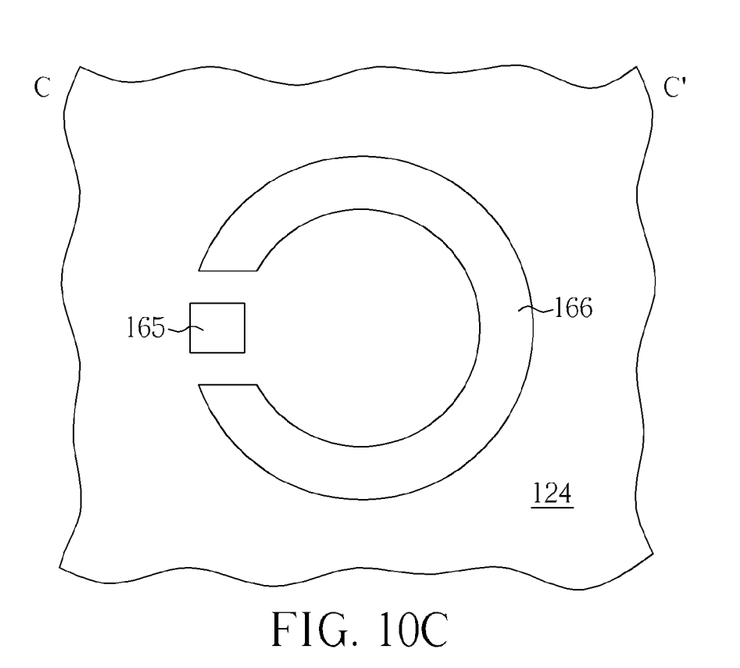

FIG. 10A, FIG. 10B and FIG. 10C illustrate the top views of different layers in the multi-layer metal structure 160. FIG. 10A illustrates the top view of the A-A' plane as illustrated in FIG. 9. FIG. 10B illustrates the top view of the B-B' plane as illustrated in FIG. 9. FIG. 10C illustrates the top view of the C-C' plane as illustrated in FIG. 9. The shapes of the third conductive structure 163 and the second conductive structure 162 are not limited to the above examples. Any shape will do as long as the shape has an effective electrical connection and shielding effect.

The first conductive structure 161, the second conductive structure 162 and the third conductive structure 163 in the multi-layer metal structure 160 may respectively include multiple layers. For example, when the second conductive structure 162 includes 1 to $m^{th}$ layer, the first conductive structure 161 may at most include 1 to m−$1^{th}$ layer, and the third conductive structure 163 may at least include 1 to m+$1^{th}$ layer. Optionally, as shown in FIG. 10, the conductive layer extension part 165 may have a curved structure 167, such as a serpent-like or zigzag structure to transport the signal to the topmost layer.

After the previous steps, a resultant through-silicon via structure 100 of the present invention is obtained. As shown in FIGS. 7-10, the wafer 103 includes a substrate 103, a first side 101 and a second side 102. The through via 115 is disposed in the wafer 103 to connect the first side 101 and the second side 102. The through-silicon via structure 100 of the present invention is characterized in the composite annular structure 110. The composite annular structure 110 includes at least a core conductive material 150, a through via dielectric ring 112, a first substrate ring 113 or a first conductive ring 151, and a first dielectric ring 114. The first conductive ring 151 includes a first conductive material 151.

The composite annular structure 110 is usually a concentric structure. The core conductive layer 150 usually includes a low-resistant material, such as copper. The core conductive layer 150 of the through-silicon via structure 100 fills up the through via 115 and may be in a form of a column with a diameter of 5 μm-20 μm. A smaller column facilitates increasing the element density of the entire wafer. The through via dielectric ring 112 may include a dielectric material, such as silicon oxide, and surrounds and directly contacts the core substrate column 111. The first substrate ring 113 or the first conductive ring 151 is located outside of the through via dielectric ring 112 so it surrounds and directly contacts the through via dielectric ring 112. The first dielectric ring 114 may include a dielectric material, such as silicon oxide, and is located outside of the first substrate ring 113 or the first conductive ring 151 so it surrounds and directly contacts the first substrate ring 113 or the first conductive ring 151 and it is at the same time surrounded by the semiconductor substrate 103 in the wafer. On one hand, optionally, the core conductive layer 150 and first conductive material 151 may be the same or different from each other. On the other hand, optionally, the ring thickness of the through via dielectric ring 112 and the first dielectric ring 114 in the composite annular structure 110 may be 2 μm-3 μm.

Optionally, as shown in FIG. 8, at least a set of concentric conductive ring and dielectric ring may be formed outside of the first dielectric ring 114. For example, a second conductive ring 152 and a second dielectric ring 117 are formed. On one hand, the second conductive ring 152 surrounds and directly contacts the first dielectric ring 114. On the other hand, the second dielectric ring 117 surrounds and directly contacts the second conductive ring 152, and is surrounded by the wafer 103.

There may be an optional semiconductor element 120 disposed on the first side 101 of the wafer 103. There also may be an optional interlayer dielectric layer 124 covering the semiconductor element 120 as well as an optional interconnection structure 125 disposed on the interlayer dielectric layer 124 and electrically connected to the semiconductor element 120. The semiconductor element 120 may include a gate 123, and a source 121 and a drain 122 disposed adjacent to the gate 123. The interconnection structure 125 penetrates the interlayer dielectric layer 124 and is electrically connected to the corresponding source 121, the drain 122 and the gate 123 on the first side 101 through some contact plugs 126.

Optionally, as shown in FIG. 9, the interconnection structure 125 may be a multi-layer metal structure 160. The multi-layer metal structure 160 may be disposed on the first side 101 and includes a first conductive structure 161, a second conductive structure 162 and a third conductive structure 163. In one embodiment of the present invention, the second conductive structure 162 and the third conductive structure 163 may respectively have a void. For example, as shown in FIG. 10A, the third conductive structure 163 may be a ring with a void which allows the second conductive structure 162 to pass through. Or alternatively, the second conductive structure 162 may be a round with a void which allows the first conductive structure 161 to pass through. In such a way, the needed multi-layer metal structure 160 is constructed.

In addition, as shown in FIG. 9, the first conductive material 151 may form the first conductive ring first extension part 164 with the first conductive structure 161 so the first conductive ring first extension part 164 is formed from the first conductive structure 161. Similarly, the first conductive material 151 may form the first conductive ring third extension part 166 with the third conductive structure 163 so the first conductive ring third extension part 166 is formed from the third conductive structure 163. Besides, the second conductive structure 162 in the multi-layer metal structure 160 forms a conductive layer second extension part 165. In such a way, the first conductive ring first extension part 164 and the first conductive ring third extension part 166 together sandwich the conductive layer second extension part 165 to shield the adverse interaction between the wafer 103 and the conductive layer second extension part 165.

The first conductive structure 161, the second conductive structure 162 and the third conductive structure 163 in the multi-layer metal structure 160 may respectively include multiple layers. For example, the layers of the second conductive structure 162 are more than that of the first conductive structure 161, but less than these of the third conductive structure 163. Optionally, as shown in FIG. 10, the conductive layer extension part 165 may have a curved structure 167, such as a serpent-like or zigzag structure so that the conductive layer extension part 165 always extends upwards to transport the signal to the topmost layer.

FIG. 10A, FIG. 10B and FIG. 10C illustrate the top views of different layers in the multi-layer metal structure 160. FIG. 10A illustrates the top view of the A-A' plane as illustrated in FIG. 9. FIG. 10B illustrates the top view of the B-B' plane as illustrated in FIG. 9. FIG. 10C illustrates the top view of the C-C' plane as illustrated in FIG. 9. The shapes of the third conductive structure 163 and the second conductive structure 162 are not limited to the above examples. Any shape will do as long as the shape has an effective electrical connection and shielding effect.

Figure 11:
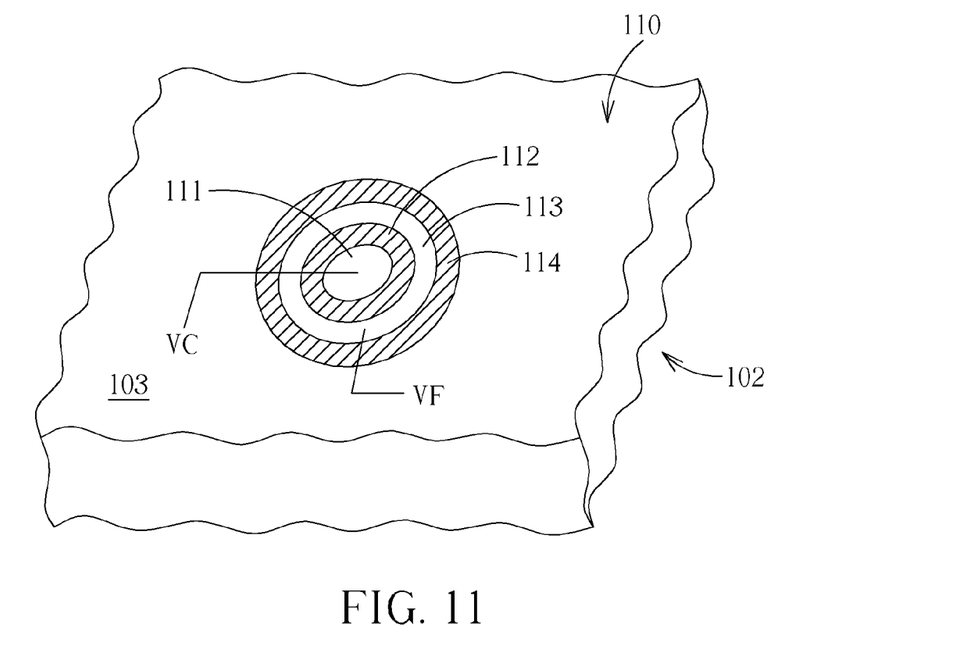
FIG. 11 illustrate to reduce or to block the adverse electrical coupling effect between the conductive substrate in the wafer and the core conductive material in the through-silicon via structure.

Please refer to FIG. 11, in accordance with another embodiment of the present invention, in order to reduce or to block the adverse electrical coupling effect between the conductive substrate 103 in the wafer and the core conductive material 150 in the through-silicon via structure 100, the core conductive material 150 and the first substrate ring 113 or the first conductive ring 151 may be respectively electrically connected to a suitable voltage by the interconnection structure. The first substrate ring 113 and the first conductive ring 151 is useful in shielding the adverse electrical coupling effect between the conductive substrate 101 in the wafer and the core conductive material 150 in the through-silicon via structure 100. For example, the core conductive material 150 is electrically connected to a core voltage, namely Vc, and the first substrate ring 113 or the first conductive ring 151 may be electrically connected to a first voltage, namely Vf. Optionally, Vc and Vf may be the same or close to each other. Or, Vc and Vf may be different. For example, Vf may be half of Vc. Suitable values of Vc and Vf are in accordance with the practice of the present invention. The interconnection structure which connects the first conductive ring 151 or the first substrate ring 113 to a suitable voltage may be an annular structure which surrounds the core conductive material 150 without in direct contact with it.

Figure 12:
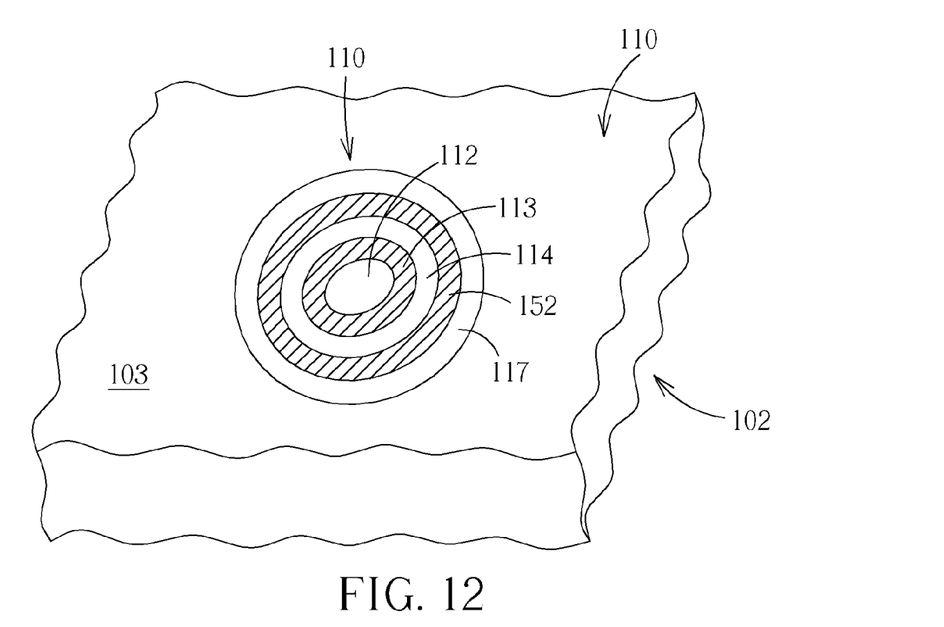

Please refer to FIG. 12. The core column in the composite annular structure 110 is not necessarily a conductive material. The core column may also be an insulting dielectric material column 112. Accordingly, the insulting dielectric material column 112 is surrounded by a first substrate ring 113 or a conductive ring. The first substrate ring 113 or a conductive ring is surrounded by a first dielectric ring 114. The first dielectric ring 114 is surrounded by another substrate ring or a second conductive ring 152. The second conductive ring 152 or a conductive ring is surrounded by a second dielectric ring 117 and the second dielectric ring 117 is surrounded by the substrate in the wafer 103.

Those skilled in the art will readily observe that numerous modifications and alterations of the device and method may be made while retaining the teachings of the invention.

What is claimed is:

1. A TSV structure comprising:
   a wafer comprising a first side and a second side;
   a through via connecting said first side and said second side;
   a conductive layer filling up said through via;
   a through via dielectric ring surrounding and directly contacting said conductive layer;
   a first conductive ring surrounding and directly contacting said through via dielectric ring, wherein said first conductive ring and said wafer are of the same material; and
   a first dielectric ring surrounding and directly contacting said first conductive ring, and surrounded by said wafer.

2. The TSV structure of claim 1, wherein said conductive layer is electrically connected to a core voltage and said first conductive ring is electrically connected to a first voltage and said core voltage and said first voltage are substantially the same.

3. The TSV structure of claim 1, wherein said conductive layer is electrically connected to a core voltage and said first conductive ring is electrically connected to a first voltage and said core voltage is different from said first voltage.

4. The TSV structure of claim 1, wherein said first conductive ring is for use in shielding the interaction between said conductive layer and said wafer.

5. The TSV structure of claim 1, wherein said conductive layer has a core conductive material and said first conductive ring has a first conductive material and said core conductive material and said first conductive material are substantially the same.

6. The TSV structure of claim 1, wherein said conductive layer has a core conductive material and said first conductive ring has a first conductive material and said core conductive material is different from said first conductive material.

7. The TSV structure of claim 1, further comprising:
   a second conductive ring surrounding and directly contacting said first dielectric ring; and
   a second dielectric ring surrounding and directly contacting said second conductive ring, and surrounded by said wafer.

8. The TSV structure of claim 1, wherein said conductive layer has a column structure with a diameter of 5 μm-20 μm.

9. The TSV structure of claim 1, further comprising:
   a multi-layer metal structure disposed on said first side and comprising a first layer, a second layer and a third layer;
   a first conductive ring first extension part composed of said first layer;
   a first conductive ring third extension part composed of said third layer; and
   a conductive layer second extension part composed of said second layer, wherein said first conductive ring first extension part and said first conductive ring third extension part together sandwich said conductive layer second extension part to shield said conductive layer extension part.

10. The TSV structure of claim 1, wherein said conductive layer second extension part has a serpent-like structure.

11. A method for forming a through-silicon via structure, comprising:
    providing a wafer comprising a substrate, a first side and a second side;
    forming an composite annular structure in said wafer, wherein said composite annular structure comprises:
       a core substrate column;
       a through via dielectric ring comprising a dielectric material and surrounding and directly contacting said core substrate column;
       a first substrate ring surrounding and directly contacting said through via dielectric ring; and
       a first dielectric ring surrounding and directly contacting said first substrate ring, and surrounded by said wafer;
    thinning said wafer from the second side to expose said composite annular structure;
    forming a second dielectric layer to cover the second side and to expose said composite annular structure;
    completely removing said substrate in said core substrate column to form a through via which connects said first side and said second side; and
    filling up said through via with a core conductive layer to obtain said through-silicon via structure.

12. The method of claim 11, further comprising performing a semiconductor procedure after said through-silicon via structure is obtained.

13. The method of claim 11, further comprising performing a semiconductor procedure before said through-silicon via structure is obtained.

14. The method of claim 11, further comprising completely removing said first substrate ring to form a first hollow ring; and
    filling up said first hollow ring with a first conductive material.

15. The method of claim 14, wherein said core conductive material and said first conductive material are substantially the same.

16. The method of claim 14, wherein said core conductive material is different from said first conductive material.

17. The method of claim 11, further comprising:
   forming a second conductive ring surrounding and directly contacting said first dielectric ring; and
   forming a second dielectric ring surrounding and directly contacting said second conductive ring, and surrounded by said wafer.

18. The method of claim 11, wherein said conductive layer has a column structure with a diameter of 5 µm-20 µm.

19. The method of claim 11, further comprising:
   forming a multi-layer metal structure disposed on said first side and comprising a first layer, a second layer and an third layer;
   forming a first conductive ring first extension part composed of said first layer;
   forming a first conductive ring third extension part composed of said third layer; and
   forming a conductive layer second extension part composed of said second layer.

20. The method of claim 19, wherein said first conductive ring first extension part and said first conductive ring third extension part together sandwich said conductive layer second extension part to shield said conductive layer second extension part.

21. The method of claim 20, wherein said conductive layer second extension part has a zigzag structure.

* * * * *

UNITED STATES PATENT AND TRADEMARK OFFICE
CERTIFICATE OF CORRECTION

PATENT NO. : 8,519,515 B2
APPLICATION NO. : 13/085488
DATED : August 27, 2013
INVENTOR(S) : Chien-Li Kuo et al.

It is certified that error appears in the above-identified patent and that said Letters Patent is hereby corrected as shown below:

On the title page, item (73), correct the name of the assignee from "United Microlectronics Corp." to --United Microelectronics Corp.--.

Signed and Sealed this
Twenty-ninth Day of October, 2013

Teresa Stanek Rea
*Deputy Director of the United States Patent and Trademark Office*